(12) United States Patent
Chi et al.

(10) Patent No.: US 9,502,267 B1
(45) Date of Patent: Nov. 22, 2016

(54) INTEGRATED CIRCUIT PACKAGING SYSTEM WITH SUPPORT STRUCTURE AND METHOD OF MANUFACTURE THEREOF

(71) Applicants: HeeJo Chi, Yeoju-gun (KR); Bartholomew Liao Chung Foh, Singapore (SG); Sheila Marie L. Alvarez, Singapore (SG); Zigmund Ramirez Camacho, Singapore (SG); Dao Nguyen Phu Cuong, Singapore (SG)

(72) Inventors: HeeJo Chi, Yeoju-gun (KR); Bartholomew Liao Chung Foh, Singapore (SG); Sheila Marie L. Alvarez, Singapore (SG); Zigmund Ramirez Camacho, Singapore (SG); Dao Nguyen Phu Cuong, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/316,190

(22) Filed: Jun. 26, 2014

(51) Int. Cl.
  *H01L 21/48* (2006.01)
  *H01L 21/56* (2006.01)
  *H01L 23/538* (2006.01)

(52) U.S. Cl.
  CPC ........ *H01L 21/4857* (2013.01); *H01L 21/568* (2013.01); *H01L 23/5383* (2013.01)

(58) Field of Classification Search
  CPC ........... H01L 21/4857; H01L 23/5383; H01L 21/568
  See application file for complete search history.

(56) References Cited

U.S. PATENT DOCUMENTS

| | | |
|---|---|---|
| 4,888,450 A | 12/1989 | Lando et al. |
| 5,324,687 A | 6/1994 | Wojnarowski |
| 6,670,718 B2 | 12/2003 | Chinda et al. |
| 7,365,006 B1 | 4/2008 | Huemoeller et al. |
| 7,543,374 B2 | 6/2009 | Nakamura |
| 7,939,377 B1 | 5/2011 | Katagiri et al. |
| 7,981,728 B2 | 7/2011 | Cho |
| 8,294,276 B1 | 10/2012 | Kim et al. |
| 8,416,577 B2 | 4/2013 | Wang et al. |
| 8,624,382 B2 | 1/2014 | Tseng et al. |
| 2007/0076348 A1 | 4/2007 | Shioga et al. |
| 2009/0183909 A1* | 7/2009 | Cho .............................. 174/262 |
| 2010/0052127 A1 | 3/2010 | Choi et al. |
| 2014/0027167 A1 | 1/2014 | Kim et al. |
| 2014/0035095 A1 | 2/2014 | Lin et al. |
| 2014/0326295 A1* | 11/2014 | Moslehi ........................ 136/249 |
| 2015/0008566 A1 | 1/2015 | Gerber et al. |

FOREIGN PATENT DOCUMENTS

KR  10-20100093356  9/2010

OTHER PUBLICATIONS

U.S. Appl. No. 14/316,013, filed Jun. 26, 2014, Chi et al.
Electronic Materials & System Equipment Group Functional Materials Division, MSDS No. EL-AE1244-13 , Material Safety Data Sheet, Aug. 24, 2011, p. 4, Tatsuta Electric Wire & Cable Co., Ltd.

(Continued)

*Primary Examiner* — John P Dulka
(74) *Attorney, Agent, or Firm* — Wong & Rees LLP

(57) ABSTRACT

An integrated circuit packaging system, and a method of manufacture thereof, includes: a support structure having: an internal insulation layer having a hole, a device connection side, and a removal mark characteristic of a conductive seed layer removed at the device connection side, a first conductive pad in the hole at the device connection side, and an exterior insulation layer over the first conductive pad at the device connection side; an integrated circuit over the exterior insulation layer; and an encapsulation over the integrated circuit.

20 Claims, 7 Drawing Sheets

(56) References Cited

OTHER PUBLICATIONS

Electronic Materials & System Equipment Group Functional Materials Division, MSDS No. EL-AE1650-7, Material Safety Data Sheet, Oct. 31, 2013, p. 4 Tatsuta Electric Wire & Cable Co.,Ltd.

Electronic Materials & System Equipment Group Functional Materials Division, MSDS No. EL-AE3030-10, Material Safety Data Sheet May 18, 2011. p. 4, Tatsuta Electric Wire & Cable Co., Ltd..
Samsung Electro-Mechanics, Introduction of Conductive paste filled CSP, Confidential, Aug. 12, 2010, p. 9 Samsung.

* cited by examiner

INTEGRATED CIRCUIT PACKAGING SYSTEM WITH SUPPORT STRUCTURE AND METHOD OF MANUFACTURE THEREOF

CROSS-REFERENCE TO RELATED APPLICATION(S)

The present application contains subject matter related to concurrently filed U.S. patent application Ser. No. 14/316,013. The related application is assigned to STATS ChipPAC Ltd. and the subject matter thereof is incorporated herein by reference thereto.

The present application contains subject matter related to concurrently filed U.S. patent application Ser. No. 14/316,090. The related application is assigned to STATS ChipPAC Ltd. and the subject matter thereof is incorporated herein by reference thereto.

TECHNICAL FIELD

The present invention relates generally to an integrated circuit packaging system, and more particularly to a system for an integrated circuit packaging system with a support structure.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a support structure including: providing a carrier having a conductive seed layer, forming an interior insulation layer directly on the conductive seed layer, forming an internal insulation layer directly on the interior insulation layer and the conductive seed layer, removing the conductive seed layer at a device connection side of the internal insulation layer, forming a hole of the internal insulation layer with the interior insulation layer removed at the device connection side, forming a first conductive pad in the hole at the device connection side, and forming an exterior insulation layer over the first conductive pad; mounting an integrated circuit over the exterior insulation layer at the device connection side; and forming an encapsulation over the integrated circuit.

The present invention provides an integrated circuit packaging system, including: a support structure having: an internal insulation layer having a hole, a device connection side, and a removal mark characteristic of a conductive seed layer removed at the device connection side, a first conductive pad in the hole at the device connection side, and an exterior insulation layer over the first conductive pad at the device connection side; an integrated circuit over the exterior insulation layer; and an encapsulation over the integrated circuit.

Certain embodiments of the invention have other steps or elements in addition to or in place of those mentioned above. The steps or the elements will become apparent to those skilled in the art from a reading of the following detailed description when taken with reference to the accompanying drawings.

BEST MODE FOR CARRYING OUT THE INVENTION

Figure 1:
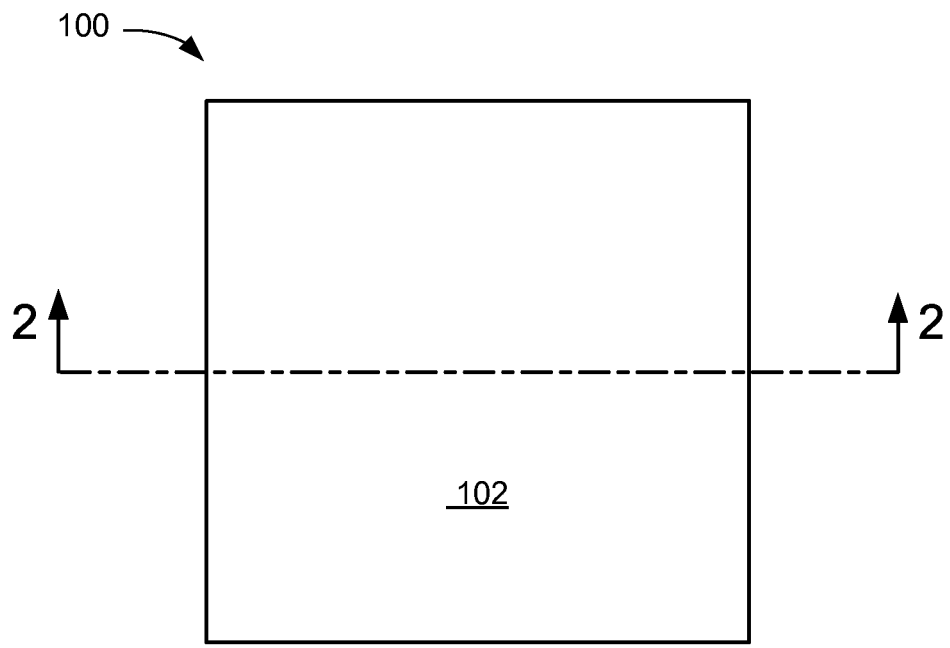
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can include an encapsulation 102, which is a body or a molded structure of a package. The encapsulation 102 can be formed with a molding material including a molding compound.

Figure 2:
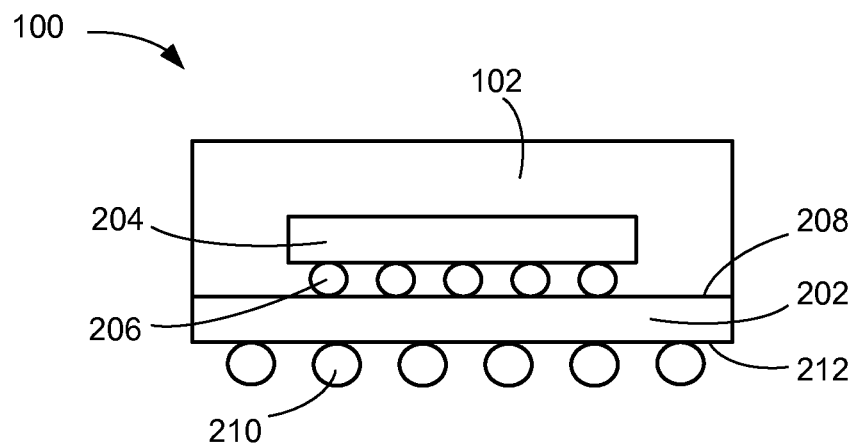
FIG. 2 is a cross-sectional view of the integrated circuit packaging system taken along line 2-2 of FIG. 1.

Referring now to FIG. 2, therein is shown a cross-sectional view of the integrated circuit packaging system 100 taken along line 2-2 of FIG. 1. The integrated circuit packaging system 100 can include a support structure 202 for mounting and connecting a semiconductor device. The integrated circuit packaging system 100 can include an integrated circuit 204 mounted over and connected to the support structure 202.

The integrated circuit packaging system 100 can include internal connectors 206 attached to and between the integrated circuit 204 and a device side 208 of the support structure 202. The encapsulation 102 can be formed over the device side 208, the integrated circuit 204, and the internal connectors 206.

The integrated circuit packaging system 100 can include external connectors 210 attached to a system side 212 of the support structure 202 to provide electrical connectivity to an external system (not shown) at the next system level. The system side 212 is a surface of the support structure 202 opposite to the device side 208. The support structure 202 can provide electrical connections through the support structure 202 and between the device side 208 and the system side 212.

Figure 3:
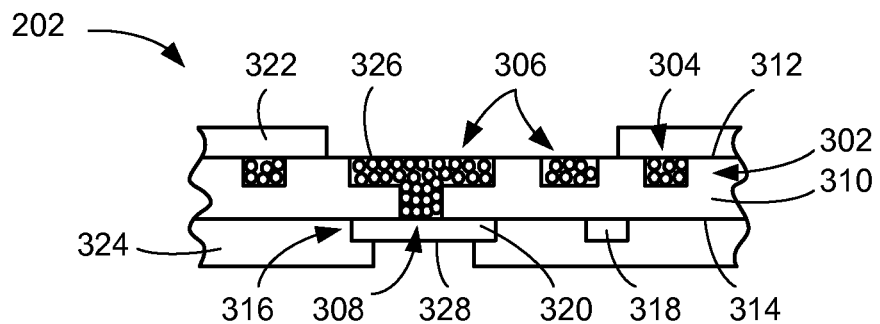
FIG. 3 is a detailed cross-sectional view of a portion of the support structure.

Referring now to FIG. 3, therein is shown a detailed cross-sectional view of a portion of the support structure 202. The support structure 202 can represent a coreless substrate with laser-free via and no via plating. For example, the support structure 202 can be an alternative to a coreless substrate formed with vias using laser and plating of the vias.

The support structure 202 can include a first conductive layer 302 having a number of first conductive traces 304 and first conductive pads 306. The first conductive traces 304 conduct electrical currents to transfer electrical signals from one location to another location within the first conductive layer 302. The first conductive pads 306 provide electrical connections between semiconductor devices attached to, mounted over, or connected to the support structure 202.

The first conductive traces 304 and the first conductive pads 306 can include an electrically conductive material. For example, the first conductive traces 304 and the first conductive pads 306 can include copper (Cu), a metallic material, or a metallic compound. Also for example, the first conductive layer 302 can represent a first metal (M1) layer.

The support structure 202 can include a number of vias 308. The vias 308 provide electrical connectivity between conductive layers within the support structure 202. The vias 308 can include an electrically conductive material. For example, the vias 308 can include copper (Cu), a metallic material, or a metallic compound.

The support structure 202 can include an internal insulation layer 310 to electrically insulate or physically isolate conductive traces, pads, and layers in the support structure 202. The internal insulation layer 310 can include an insulation material, such as a dielectric or a molding material. The first conductive traces 304, the first conductive pads 306, and the vias 308 can be formed partially within the internal insulation layer 310. The internal insulation layer 310 is within the support structure 202.

The internal insulation layer 310 can be partially directly on and partially covering the first conductive traces 304, the first conductive pads 306, and the vias 308. The first conductive pads 306 and the first conductive pads 306 can be partially exposed from the internal insulation layer 310 at a device connection side 312 of the internal insulation layer 310. The vias 308 can be partially exposed from the internal insulation layer 310 at a system connection side 314 of the internal insulation layer 310. The system connection side 314 is opposite to the device connection side 312.

The support structure 202 can include a second conductive layer 316 having a number of second conductive traces 318 and second conductive pads 320. The second conductive traces 318 conduct electrical currents to transfer electrical signals from one location to another location within the second conductive layer 316. The second conductive traces 318 and the second conductive pads 320 can be directly on the system connection side 314. The second conductive pads 320 can be directly on the vias 308.

The second conductive pads 320 provide electrical connections between semiconductor devices in the external system connected to the support structure 202. The second conductive pads 320 can be electrically connected to the first conductive pads 306 through the vias 308.

The second conductive traces 318 and the second conductive pads 320 can include an electrically conductive material. For example, the second conductive traces 318 and the second conductive pads 320 can include copper (Cu), a metallic material, or a metallic compound. Also for example, the second conductive layer 316 can represent a second metal (M2) layer.

The support structure 202 can include a first exterior insulation layer 322 and a second exterior insulation layer 324. The first exterior insulation layer 322 and the second exterior insulation layer 324 eliminate electrical bridges or electrical shorts, eliminate contamination to conductive layers, and protect circuitry from handling damage, dirt, and fingerprints.

The first exterior insulation layer 322 can be over or directly on the first conductive traces 304 and the device connection side 312. The first exterior insulation layer 322 can partially expose the first conductive pads 306 and the internal insulation layer 310. The first exterior insulation layer 322 can expose the first pad external surfaces 326 of the first conductive pads 306. The first pad external surfaces 326 can be attached to the internal connectors 206 of FIG. 2.

The second exterior insulation layer 324 can be over or directly on the second conductive traces 318 and the system connection side 314. The second exterior insulation layer 324 can be over or partially directly on the second pad external surfaces 328 of the second conductive pads 320. The second exterior insulation layer 324 can expose the second pad external surfaces 328 of the second conductive pads 320. The second pad external surfaces 328 can be attached to the external connectors 210 of FIG. 2.

The internal connectors 206 can be electrically connected to the integrated circuit 204 of FIG. 2, which can include a semiconductor device, such as an integrated circuit die, a flip-chip integrated circuit, or a wirebond integrated circuit. For example, the internal connectors 206 can include electrical conductors, such as solder bumps, bond wires, or any other electrically conductive connectors. Also for example, the external connectors 210 can include electrical conductors, such as solder balls, studs, posts, or any other electrically conductive connectors.

The support structure 202 can optionally include a layer of a surface finish (not shown) on the second pad external surfaces 328. The layer of the surface finish can be exposed from the second exterior insulation layer 324.

The embodiments of the present invention provide an alternative low cost solution compared to conventional coreless substrates, including single metal substrates (SMS) and embedded trace substrates (ETS), by process flow simplification and low cost material processes.

The process flow simplification can include elimination of laser drilling process for via-hole formation by using dry film (DF) or other protection coating materials. The process flow simplification can include replacement of via and metal-1 (M1) layer pattern plating with conductive paste filling.

There may not be a need to concern about a conductive paste collapses in fine line/space (L/S) due to trenched trace and pad shapes. Design relaxation due to free from via aspect ratio (A/R) or via diameter and height over via plating method.

The cost effectiveness of the embodiments compared with the conventional coreless substrates can be due to elimination of laser drilling processes and replacement of via and M1 layer plating with conductive paste filling. A cost comparison shows that the embodiments of the present invention can be cheaper than that of the conventional coreless substrates and thus can be cost effective. The cost comparison can be estimated to provide substrate cost savings by 20%.

For example, the conductive paste can be provided by Samsung Electro Mechanics (SEMCO) based on "Introduction of Conductive paste filled CSP", Aug. 12, 2010. Also for example, the conductive paste including copper (Cu) can be handled according to Material Safety Data Sheets (MSDS) provided by Tatsuta Electric Wire & Cable Co., Ltd. Based on MSDS numbers EL-AE3030-10, May 18, 2011, EL-AE1244-13, Aug. 24, 2011, and EL-AE1650-7, Oct. 31, 2013.

It has been unexpectedly found that the support structure 202 having the first conductive traces 304, the first conductive pads 306, and the vias 308 formed partially within the internal insulation layer 310 provides improved reliability. The improved reliability is provided because the first conductive traces 304, the first conductive pads 306, and the vias 308 are formed with a conductive paste without any concern of conductive paste collapses due to the internal insulation layer 310 having trenched shapes.

Figure 4:
FIG. 4 is a cross-sectional view of a portion of the support structure of FIG. 2 in a core-formation phase of manufacture.

Referring now to FIG. 4, therein is shown a cross-sectional view of a portion of the support structure 202 of FIG. 2 in a core-formation phase of manufacture. The integrated circuit packaging system 100 of FIG. 1 can include a carrier 402 having a core 404 and a conductive seed layer 406 formed directly on each side of the core 404.

The carrier 402 can represent a detach core. The carrier 402 can be used for a process support carrier until separation in a detach core process. For example, the carrier 402 can include FR4 Cu clad laminate (CCL).

Figure 5:
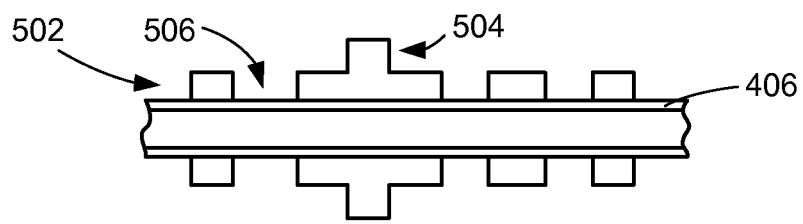
FIG. 5 is the structure of FIG. 4 in a deposition phase.

Referring now to FIG. 5, therein is shown the structure of FIG. 4 in a deposition phase. The deposition phase can include a first interior insulation layer 502 and a second interior insulation layer 504. The first interior insulation layer 502 and the second interior insulation layer 504 can include an insulation material, such as a dry film, a photo-resist material, a coating material, or any other insulative materials. For example, the first interior insulation layer 502 and the second interior insulation layer 504 can represent protection layers.

The first interior insulation layer 502 can be formed directly on the conductive seed layer 406. The first interior insulation layer 502 can include first insulation holes 506. The second interior insulation layer 504 can be formed directly on the first interior insulation layer 502.

The first interior insulation layer 502 and the second interior insulation layer 504 can be formed using a deposition method, a coating method, or any other insulation formation methods. The first interior insulation layer 502 and the second interior insulation layer 504 can also be formed using a two-step lamination and development method or a two-step coating material screen, print, and curing method.

As an example, when processing the second interior insulation layer 504, the first interior insulation layer 502 can be cured and may not be affected by an expose-and-develop process of the second interior insulation layer 504. This can be similar to a process in which when the first interior insulation layer 502 is developed, a chemical may not attack or affect a cured portion of the first interior insulation layer 502.

As a specific example, a dry film (DF) can be stripped or removed using a chemical, including a concentrated alkaline solution, different from a developing chemical. The stripping chemical can dissolve a cured DF. As another specific example, a two-DF formation process can include a molded interconnect substrate (MIS) technology.

For example, the two-DF formation process can form a trace layer for the first interior insulation layer 502 using methods in an order of DF lamination, photo imaging, DF development, and metal, such as copper (Cu), plating. The two-DF formation process can form a stud layer for the second interior insulation layer 504 using methods in an order of DF lamination, photo imaging, DF development, and metal, such as copper (Cu), plating.

After the two-DF formation process, other methods employed can include methods in an order of DF stripping, molding, surface grinding, another DF lamination, exposure and development, and window etch and DF stripping. The other methods can also include singulation, pre-plated lead-frame (PPF) plating, final inspection, packing, and shipment.

Figure 6:
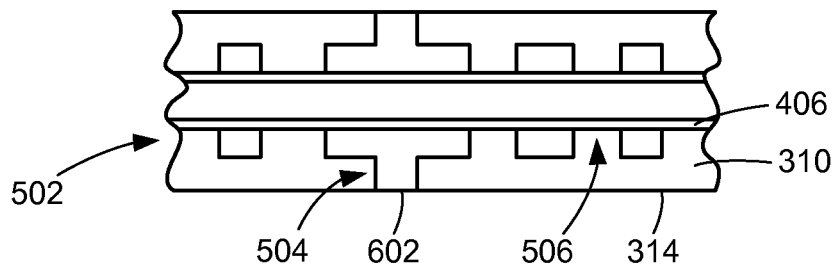
FIG. 6 is the structure of FIG. 5 in a mold-formation phase.

Referring now to FIG. 6, therein is shown the structure of FIG. 5 in a mold-formation phase. The mold-formation phase can be employed after the deposition phase. The mold-formation phase can be employed immediately after the deposition phase without or by skipping an electrolytic plating process and an insulation removal process in between the deposition phase and the mold-formation phase.

For example, the electrolytic plating process can include an electrolytic copper (Cu) plating. Also for example, the insulation removal process can include a dry film (DF) stripping.

The internal insulation layer 310 can be formed over or directly on the conductive seed layer 406, the first interior insulation layer 502, and the second interior insulation layer 504. The internal insulation layer 310 can be formed within the first insulation holes 506. The system connection side 314 of the internal insulation layer 310 can be coplanar with a second insulation exterior side 602 of the second interior insulation layer 504.

The internal insulation layer 310 can be formed using an encapsulation process, such as lamination or molding. For example, the encapsulation process can include a dielectric layer lamination process or a molding process. Also for example, the encapsulation process can include compression mold with film-assisted molding (FAM), which can partially expose a protection layer or the second interior insulation layer 504 directly.

Further, for example, in lamination or other processes, an additional process to expose the protection layer or the second interior insulation layer 504 may be required including a process for grinding or buffing after the dielectric layer lamination process. Furthermore, the additional process can include a process for molding or deflash, a process for desmear, or a process for laser ablation after rinsing the protection layer or the second interior insulation layer 504.

Figure 7:
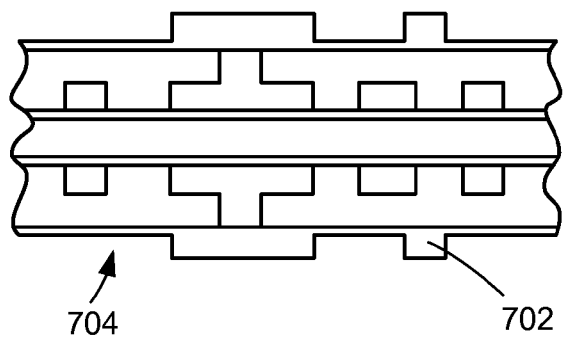
FIG. 7 is the structure of FIG. 6 in a pattern-formation phase.

Referring now to FIG. 7, therein is shown the structure of FIG. 6 in a pattern-formation phase. The pattern-formation phase can be employed after the mold-formation phase. The pattern-formation phase can be employed immediately after the mold-formation phase without or by skipping an encapsulation removal process. For example, the encapsulation removal process can include a laser drill step or method applied to a dielectric layer for forming vias in the dielectric layer.

The pattern-formation phase can include a layer patterning method for forming an upper conductive layer 702 having recesses 704. For example, the layer patterning method can include a metal-2 (M2) layer patterning method.

Figure 8:
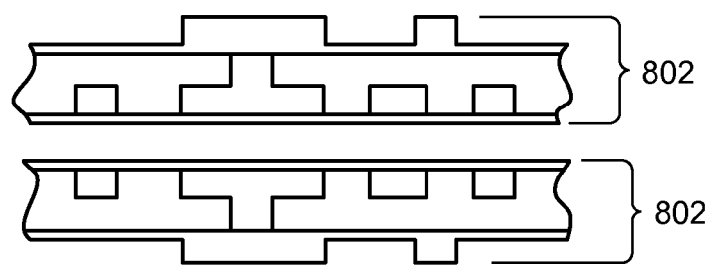
FIG. 8 is the structure of FIG. 7 in a separation phase.

Referring now to FIG. 8, therein is shown the structure of FIG. 7 in a separation phase. The separation phase can include a process that separates the structure of FIG. 7 into two sub-assemblies 802 by removing the core 404 of FIG. 4.

Figure 9:
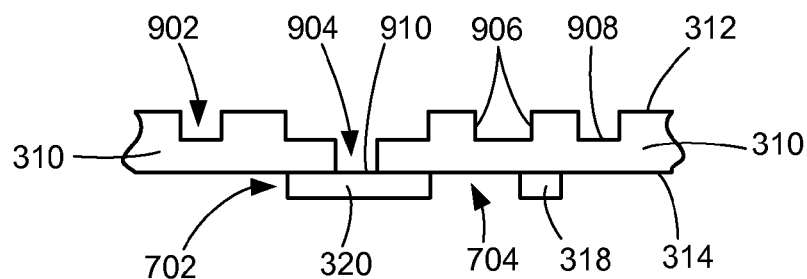
FIG. 9 is the structure of FIG. 8 in a removal phase.

Referring now to FIG. 9, therein is shown the structure of FIG. 8 in a removal phase. The conductive seed layer 406 of FIG. 4 can be removed at the device connection side 312 of the internal insulation layer 310 in the removal phase. For example, the conductive seed layer 406 of FIG. 4 can be removed using a removal method, such as etching, grinding, sanding, chemical removal methods, or any other conductor removal methods.

The internal insulation layer 310 can include a physical feature at the device connection side 312 characteristic of the conductive seed layer 406 removed. The physical feature can include etched marks, removal tool marks, chemical residues, chemically processed surfaces, rough surfaces, uneven surfaces, or concave surfaces.

The upper conductive layer 702 can be partially removed. The upper conductive layer 702 can be removed within the recesses 704 to form the second conductive traces 318 and the second conductive pads 320.

The upper conductive layer 702 can be partially removed using a removal method, such as etching, grinding, sanding, chemical removal methods, or any other conductor removal methods. The internal insulation layer 310 can include a physical feature at the system connection side 314 of the internal insulation layer 310 within the recesses 704 characteristic of the upper conductive layer 702 partially removed. The physical feature can include etched marks, removal tool marks, chemical residues, chemically processed surfaces, rough surfaces, uneven surfaces, or concave surfaces.

The first interior insulation layer 502 of FIG. 5 and the second interior insulation layer 504 of FIG. 5 can be removed at the device connection side 312 of the internal insulation layer 310 in the removal phase. The first interior insulation layer 502 and the second interior insulation layer 504 can be removed using a removal method, such as rinsing, chemical removal methods, or any other insulation removal methods.

The internal insulation layer 310 can include holes forming the trenched shapes previously described with the first interior insulation layer 502 and the second interior insulation layer 504 removed. The internal insulation layer 310 can include upper holes 902 and lower holes 904 below the upper holes 902 after the first interior insulation layer 502 and the second interior insulation layer 504 are removed, respectively.

The internal insulation layer 310 can include a physical feature at sidewalls 906 and interior surfaces 908 of the internal insulation layer 310 within the upper holes 902 and the lower holes 904 characteristic of the first interior insulation layer 502 and the second interior insulation layer 504 removed, respectively. The physical feature can include residues of an insulation material or chemically processed surfaces.

The second conductive pads 320 can include a physical feature partially at second pad internal surfaces 910 of the second conductive pads 320 and within the lower holes 904 characteristic of the second interior insulation layer 504 removed. The physical feature can include residues of an insulation material or chemically processed surfaces.

Figure 10:
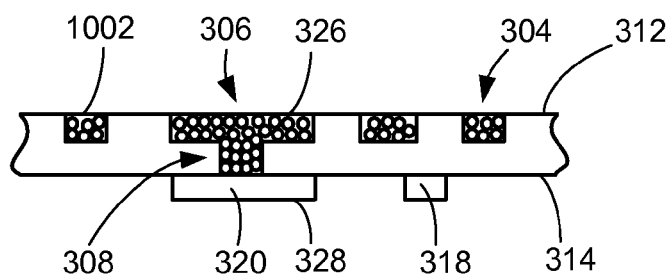
FIG. 10 is the structure of FIG. 9 in a conductor-formation phase.

Referring now to FIG. 10, therein is shown the structure of FIG. 9 in a conductor-formation phase. The conductor-formation phase can include an additional process immediately after the removal phase to form the first conductive traces 304 and the first conductive pads 306 in the upper holes 902 of FIG. 9. The additional process can also form the vias 308 in the lower holes 904 of FIG. 9. One of the first conductive pads 306 can be directly on one of the vias 308.

The additional process can include a conductor-formation process, such as a conductive paste filling. The additional process can also include a curing process to harden a conductive material.

For example, the vias 308 can be formed with any kind of conductive paste, including copper (Cu) or preferably with a conductive material having compatibility with a conductive material used to form an M1 layer or an M2 layer. The conductive material can include a material used to form the first conductive traces 304, the first conductive pads 306, the second conductive traces 318, or the second conductive pads 320.

Also for example, the additional process can include any enabling processes optionally followed by a planarization process. The planarization process can be used to form the device connection side 312, the first pad external surfaces 326, and first trace external surfaces 1002 of the first conductive traces 304 coplanar with each other.

The first exterior insulation layer 322 of FIG. 3 can be over or directly on the first conductive traces 304 and the device connection side 312. The first exterior insulation layer 322 can expose the first pad external surfaces 326 of the first conductive pads 306. The integrated circuit 204 of FIG. 2 can be mounted over or attached to the first exterior insulation layer 322.

The second exterior insulation layer 324 of FIG. 3 can be over or directly on the second conductive traces 318 and the system connection side 314. The second exterior insulation layer 324 can be over or partially directly on the second conductive pads 320. The second exterior insulation layer 324 can expose the second pad external surfaces 328 of the second conductive pads 320.

Figure 11:
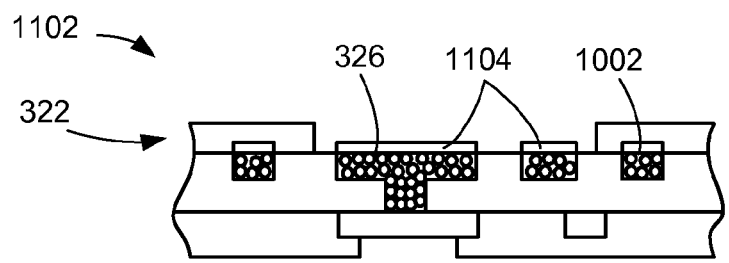
FIG. 11 is a detailed cross-sectional view of a portion of a support structure in a second embodiment of the present invention.

Referring now to FIG. 11, therein is shown a detailed cross-sectional view of a portion of a support structure 1102 in a second embodiment of the present invention. The support structure 1102 can be formed similar to the support structure 202 of FIG. 2 as described in the first embodiment, except for the description below.

The support structure 1102 can include first conductive plates 1104 formed directly on the first trace external surfaces 1002 and the first pad external surfaces 326. The first conductive plates 1104 provide attachment sites for electrical connections between semiconductor devices attached to, mounted over, or connected to the support structure 1102.

The first exterior insulation layer 322 can be formed over, covering, or directly on the first conductive plates 1104 that are directly on the first trace external surfaces 1002. The first exterior insulation layer 322 can expose the first conductive plates 1104 that are directly on the first pad external surfaces 326.

It has been unexpectedly found that the support structure 1102 having the first conductive plates 1104 directly on the first trace external surfaces 1002 and the first pad external surfaces 326 provides improved reliability. The improved reliability is provided because the first conductive plates 1104 are formed to provide reliable attachment of connectors to the support structure 1102 and thus improving signal integrity.

Figure 12:
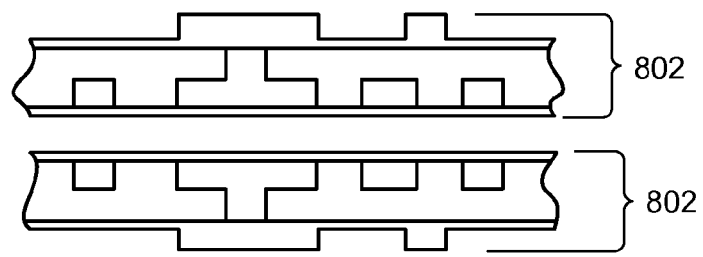
FIG. 12 is a cross-sectional view of a portion of the support structure of FIG. 11 in a separation phase of manufacture.

Referring now to FIG. 12, therein is shown a cross-sectional view of a portion of the support structure 1102 of FIG. 11 in a separation phase of manufacture. Before the separation phase, the second embodiment can include the same manufacture steps or phases of the first embodiment as shown in FIGS. 4-7. The separation phase can include a process that separates the structure of FIG. 7 into two of the sub-assemblies 802 by removing the core 404 of FIG. 4.

Figure 13:
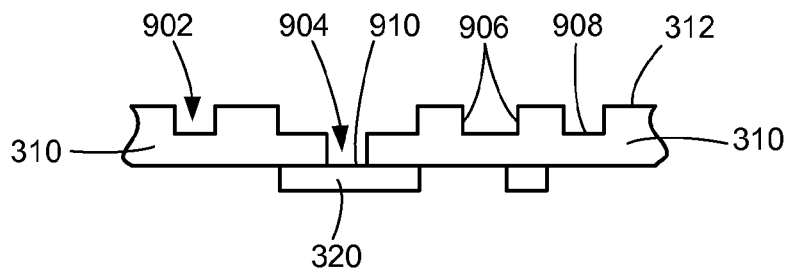
FIG. 13 is the structure of FIG. 12 in a removal phase.

Referring now to FIG. 13, therein is shown the structure of FIG. 12 in a removal phase. The conductive seed layer 406 of FIG. 4 can be removed at the device connection side 312 of the internal insulation layer 310 in the removal phase. The internal insulation layer 310 can include a physical feature at the device connection side 312 characteristic of the conductive seed layer 406 removed. The physical feature can include etched marks, removal tool marks, chemical residues, chemically processed surfaces, rough surfaces, uneven surfaces, or concave surfaces.

The first interior insulation layer 502 of FIG. 5 and the second interior insulation layer 504 of FIG. 5 can be removed in the removal phase. The internal insulation layer 310 can include the upper holes 902 and the lower holes 904 after the first interior insulation layer 502 and the second interior insulation layer 504 are removed, respectively.

The internal insulation layer 310 can include a physical feature at the sidewalls 906 and the interior surfaces 908 of the internal insulation layer 310 within the upper holes 902 and the lower holes 904 characteristic of the first interior insulation layer 502 and the second interior insulation layer 504 removed, respectively. The physical feature can include residues of an insulation material or chemically processed surfaces.

The second conductive pads 320 can include a physical feature partially at the second pad internal surfaces 910 of the second conductive pads 320 and within the lower holes 904 characteristic of the second interior insulation layer 504 removed. The physical feature can include residues of an insulation material or chemically processed surfaces.

Figure 14:
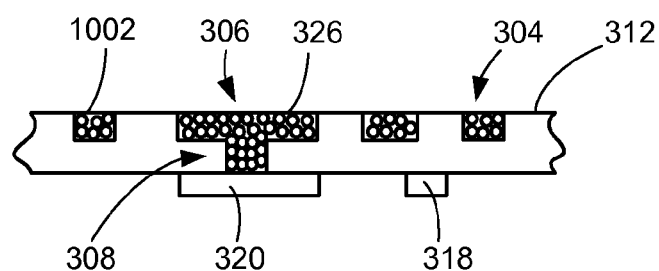
FIG. 14 is the structure of FIG. 13 in a first conductor-formation phase.

Referring now to FIG. 14, therein is shown the structure of FIG. 13 in a first conductor-formation phase. The first conductor-formation phase can include an additional process immediately after the removal phase to form the first conductive traces 304 and the first conductive pads 306 in the upper holes 902 of FIG. 9. The additional process can also form the vias 308 in the lower holes 904 of FIG. 9.

The additional process can include a conductor-formation process, such as a conductive paste filling. The additional process can also include a curing process to harden a conductive material.

For example, the first conductive traces 304, the first conductive pads 306, and the vias 308 can be formed with any kind of conductive pastes, including copper (Cu) or preferably with a conductive material having compatibility with a conductive material used to form an M2 layer or the second conductive traces 318 and the second conductive pads 320. Also for example, the additional process can include any enabling processes and optionally followed by a planarization process to form the device connection side 312, the first pad external surfaces 326, and the first trace external surfaces 1002 of the first conductive traces 304 coplanar with each other.

Figure 15:
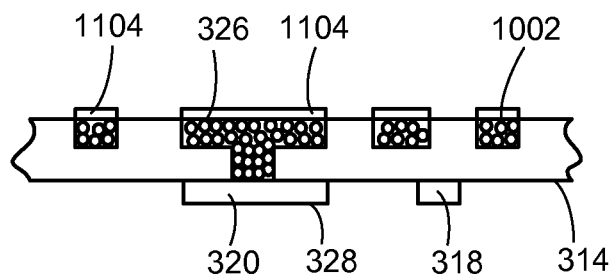
FIG. 15 is the structure of FIG. 14 in a second conductor-formation phase.

Referring now to FIG. 15, therein is shown the structure of FIG. 14 in a second conductor-formation phase. The second conductor-formation phase can include a conductor-formation process for forming the first conductive plates 1104 directly on the first trace external surfaces 1002 and the first pad external surfaces 326.

The conductor-formation process can include a conductor-formation method, such as electrolytic plating or any other conductor formation methods. The conductor-formation method can use an electrically conductive material, such as copper (Cu), gold (Au), nickel (Ni), a metallic material, or a metallic compound.

A design of the first conductive plates 1104 can be loose or flexible so that a bus type is allowed. The electrolytic plating can include bus lines (not shown) as needed. The bus lines consume real estate of circuit patterns of the first conductive plates 1104. The electrolytic plating can be employed in wire bonding packages.

The first exterior insulation layer 322 of FIG. 3 can be formed over, covering, or directly on the first conductive plates 1104 that are directly on the first trace external surfaces 1002. The first exterior insulation layer 322 can expose the first conductive plates 1104 that are directly on the first pad external surfaces 326.

The second exterior insulation layer 324 of FIG. 3 can be over or directly on the second conductive traces 318 and the system connection side 314. The second exterior insulation layer 324 can be over or partially directly on the second conductive pads 320. The second exterior insulation layer 324 can expose the second pad external surfaces 328 of the second conductive pads 320.

Figure 16:
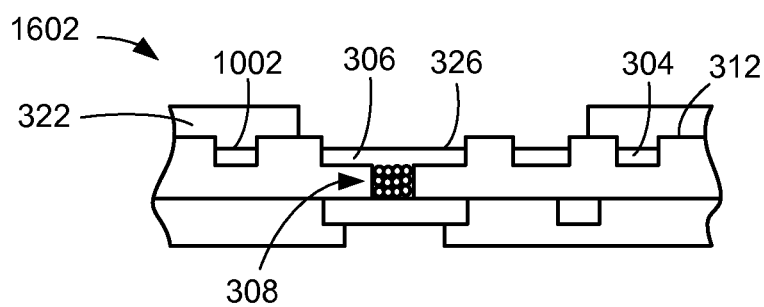
FIG. 16 is a detailed cross-sectional view of a portion of a support structure in a third embodiment of the present invention.

Referring now to FIG. 16, therein is shown a detailed cross-sectional view of a portion of a support structure 1602 in a third embodiment of the present invention. The support structure 1602 can be formed similar to the support structure 202 of FIG. 2 as described in the first embodiment, except for the description below.

The vias 308 can be formed with an electrically conductive material that is different from an electrically conductive material that is used to form the first conductive traces 304 and the first conductive pads 306. Only the vias 308 can be formed with a conductive paste.

The first conductive traces 304 and the first conductive pads 306 can be formed with any electrically conductive materials not including a conductive paste. The first pad external surfaces 326 and the first trace external surfaces 1002 can be below the device connection side 312 within the upper holes 902 of FIG. 9.

The first exterior insulation layer 322 can be over or directly on the first trace external surfaces 1002 within the upper holes 902. The first exterior insulation layer 322 can be partially within the upper holes 902.

It has been unexpectedly found that the support structure 1602 having only the vias 308 formed with a conductive paste within the internal insulation layer 310 provides improved reliability. The improved reliability is provided because the vias 308 are formed with the conductive paste without any concern of conductive paste collapses due to the internal insulation layer 310 having the trenched shapes.

It has also been unexpectedly found that the support structure 1602 having the first pad external surfaces 326 and the first trace external surfaces 1002 below the device connection side 312 within the upper holes 902 provides improved reliability. The improved reliability is provided because the device connection side 312, being above the first pad external surfaces 326 and the first trace external surfaces 1002, eliminates electrical bridges or electrical shorts among the first conductive traces 304, the first conductive pads 306, or a combination thereof.

Figure 17:
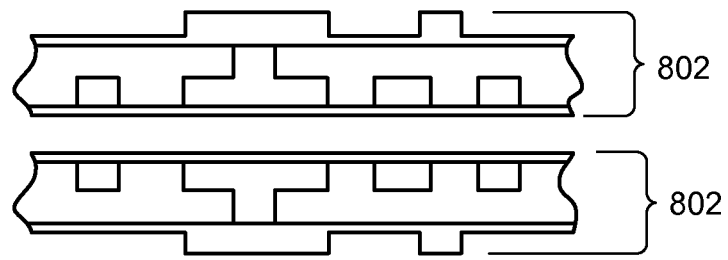
FIG. 17 is a cross-sectional view of a portion of the support structure in a separation phase of manufacture.

Referring now to FIG. 17, therein is shown a cross-sectional view of a portion of the support structure 1602 in a separation phase of manufacture. Before the separation phase, the third embodiment can include the same manufacture steps or phases of the first embodiment as shown in FIGS. 4-7. The separation phase can include a process that separates the structure of FIG. 7 into two of the subassemblies 802 by removing the core 404 of FIG. 4.

Figure 18:
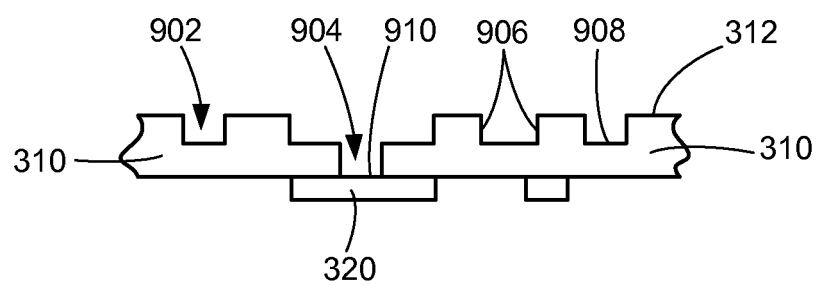
FIG. 18 is the structure of FIG. 17 in a first removal phase.

Referring now to FIG. 18, therein is shown the structure of FIG. 17 in a first removal phase. The conductive seed layer 406 of FIG. 4 can be removed at the device connection side 312 of the internal insulation layer 310 in the first removal phase. The internal insulation layer 310 can include a physical feature at the device connection side 312 characteristic of the conductive seed layer 406 removed. The physical feature can include etched marks, removal tool marks, chemical residues, chemically processed surfaces, rough surfaces, uneven surfaces, or concave surfaces.

The first interior insulation layer 502 of FIG. 5 and the second interior insulation layer 504 of FIG. 5 can be removed in the first removal phase. The internal insulation layer 310 can include the upper holes 902 and the lower holes 904 after the first interior insulation layer 502 and the second interior insulation layer 504 are removed, respectively.

The internal insulation layer 310 can include a physical feature at the sidewalls 906 and the interior surfaces 908 of the internal insulation layer 310 within the upper holes 902 and the lower holes 904 characteristic of the first interior insulation layer 502 and the second interior insulation layer 504 removed, respectively. The physical feature can include residues of an insulation material or chemically processed surfaces.

The second conductive pads 320 can include a physical feature partially at the second pad internal surfaces 910 of the second conductive pads 320 and within the lower holes 904 characteristic of the second interior insulation layer 504 removed. The physical feature can include residues of an insulation material or chemically processed surfaces.

Figure 19:
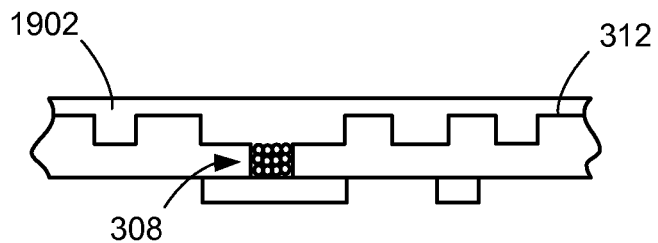
FIG. 19 is the structure of FIG. 18 in a conductor-formation phase.

Referring now to FIG. 19, therein is shown the structure of FIG. 18 in a conductor-formation phase. The conductor-formation phase can include an additional process immediately after the first removal phase.

The conductor-formation phase can include the additional process to form the vias 308 within the lower holes 904 of FIG. 9. Only the vias 308 can be formed with an electrically conductive material including a conductive paste.

The conductor-formation phase can include the additional process to form a first conductive layer 1902 within the upper holes 902 of FIG. 9 and over the device connection side 312. The first conductive layer 1902 can be formed with an electrically conductive material different from the electrically conductive material used to form the vias 308.

The additional process can also include a curing process to harden an electrically conductive material used to form the vias 308. The vias 308 and the first conductive layer 1902 can be formed with a conductor-formation process, such as electroless plating or electrolytic plating. For example, the vias 308 and the first conductive layer 1902 can be formed with an electrically conductive material, such as copper (Cu), a metallic material, or a metallic compound.

Figure 20:
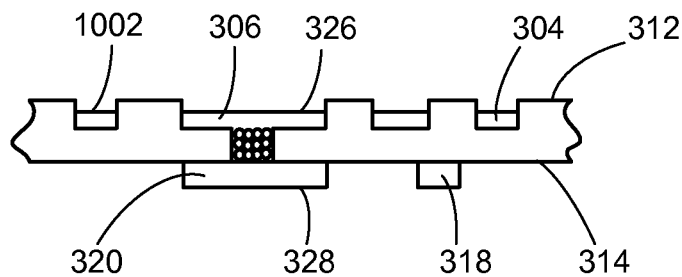
FIG. 20 is the structure of FIG. 19 in a second removal phase.

Referring now to FIG. 20, therein is shown the structure of FIG. 19 in a second removal phase. The second removal phase can include a conductor-removal method, such as etching, or other chemical or mechanical methods.

The conductor-removal method can be used to partially remove the first conductive layer 1902 of FIG. 19. The first conductive layer 1902 can be partially removed to form the first conductive traces 304 and the first conductive pads 306 in the upper holes 902 of FIG. 9.

The first conductive traces 304 can include a physical feature at the first trace external surfaces 1002 in the upper holes 902 characteristic of the first conductive layer 1902 removed. The physical feature can include etched marks, chemical residues, chemically processed surfaces, rough surfaces, uneven surfaces, or concave surfaces.

The first conductive pads 306 can include a physical feature at the first pad external surfaces 326 in the upper holes 902 characteristic of the first conductive layer 1902 removed. The physical feature can include etched marks, chemical residues, chemically processed surfaces, rough surfaces, uneven surfaces, or concave surfaces.

The first exterior insulation layer 322 of FIG. 3 can be over or directly on the first conductive traces 304 and the device connection side 312. The first exterior insulation layer 322 can be partially within the upper holes 902. The first exterior insulation layer 322 can expose the first pad external surfaces 326 of the first conductive pads 306.

The second exterior insulation layer 324 of FIG. 3 can be over or directly on the second conductive traces 318 and the system connection side 314. The second exterior insulation layer 324 can be over or partially directly on the second conductive pads 320. The second exterior insulation layer 324 can partially expose the second pad external surfaces 328.

Figure 21:
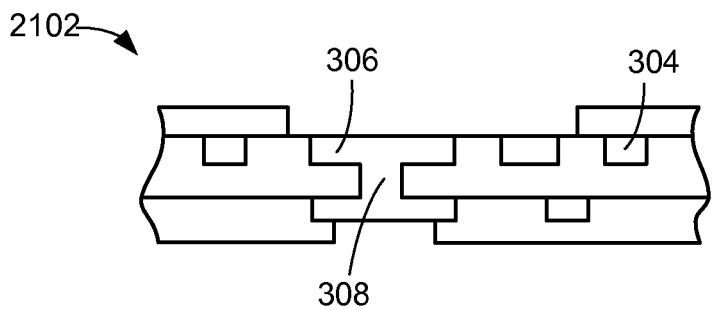
FIG. 21 is a detailed cross-sectional view of a portion of a support structure in a fourth embodiment of the present invention.

Referring now to FIG. 21, therein is shown a detailed cross-sectional view of a portion of a support structure 2102 in a fourth embodiment of the present invention. The support structure 2102 can be formed similar to the support structure 202 of FIG. 2 as described in the first embodiment, except for the description below.

The vias 308 can be formed with an electrically conductive material that is the same as an electrically conductive material used to form the first conductive traces 304 and the first conductive pads 306. The vias 308, the first conductive traces 304, and the first conductive pads 306 can be formed with an electrically conductive material, such as copper (Cu), a metallic material, or a metallic compound, not including a conductive paste.

It has been unexpectedly found that the support structure 2102 having the first conductive traces 304, the first conductive pads 306, and the vias 308 formed partially within the internal insulation layer 310 provides improved reliability. The improved reliability is provided because the first conductive traces 304, the first conductive pads 306, and the vias 308 are formed without any concern of collapses within the internal insulation layer 310 having the trenched shapes.

Figure 22:
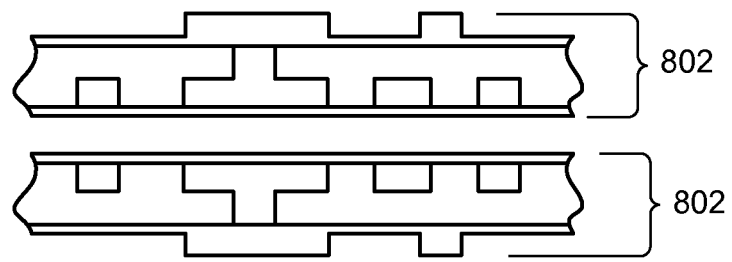
FIG. 22 is a cross-sectional view of a portion of the support structure of FIG. 21 in a separation phase of manufacture.

Referring now to FIG. 22, therein is shown a cross-sectional view of a portion of the support structure 2102 of FIG. 21 in a separation phase of manufacture. Before the separation phase, the fourth embodiment can include the same manufacture steps or phases of the first embodiment as shown in FIGS. 4-7. The separation phase can include a process that separates the structure of FIG. 7 into two of the sub-assemblies 802 by removing the core 404 of FIG. 4.

Figure 23:
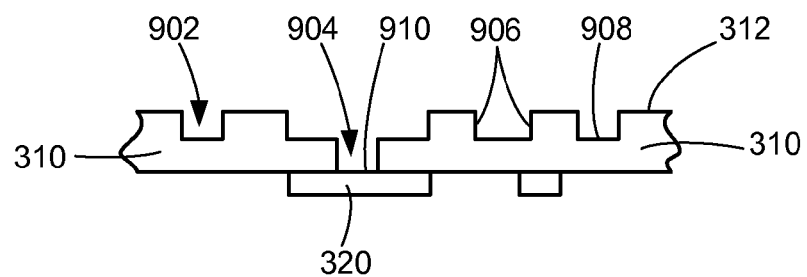
FIG. 23 is the structure of FIG. 22 in a first removal phase.

Referring now to FIG. 23, therein is shown the structure of FIG. 22 in a first removal phase. The conductive seed layer 406 of FIG. 4 can be removed at the device connection side 312 of the internal insulation layer 310 in the first removal phase. The internal insulation layer 310 can include a physical feature at the device connection side 312 characteristic of the conductive seed layer 406 removed. The physical feature can include etched marks, removal tool marks, chemical residues, chemically processed surfaces, rough surfaces, uneven surfaces, or concave surfaces.

The first interior insulation layer 502 of FIG. 5 and the second interior insulation layer 504 of FIG. 5 can be removed in the first removal phase. The internal insulation layer 310 can include the upper holes 902 and the lower holes 904 after the first interior insulation layer 502 and the second interior insulation layer 504 are removed, respectively.

The internal insulation layer 310 can include a physical feature at the sidewalls 906 and the interior surfaces 908 of the internal insulation layer 310 within the upper holes 902 and the lower holes 904 characteristic of the first interior insulation layer 502 and the second interior insulation layer 504 removed, respectively. The physical feature can include residues of an insulation material or chemically processed surfaces.

The second conductive pads 320 can include a physical feature partially at the second pad internal surfaces 910 of the second conductive pads 320 and within the lower holes 904 characteristic of the second interior insulation layer 504 removed. The physical feature can include residues of an insulation material or chemically processed surfaces.

Figure 24:
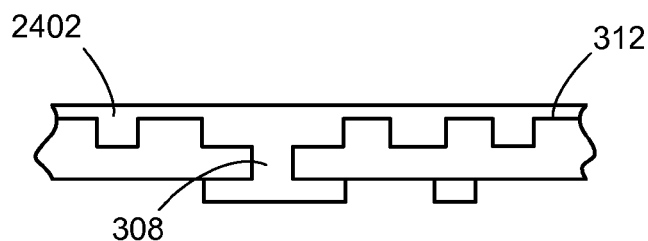
FIG. 24 is the structure of FIG. 23 in a conductor-formation phase.

Referring now to FIG. 24, therein is shown the structure of FIG. 23 in a conductor-formation phase. The conductor-formation phase can include an additional process immediately after the first removal phase.

The conductor-formation phase can include the additional process to form the vias 308 within the lower holes 904 of FIG. 9. The conductor-formation phase can include the additional process to form a first conductive layer 2402 within the upper holes 902 of FIG. 9 and over the device connection side 312. The first conductive layer 2402 can be formed with an electrically conductive material that is the same as an electrically conductive material used to form the vias 308.

The vias 308 and the first conductive layer 2402 can be formed with a conductor-formation process, such as electroless plating or electrolytic plating. For example, the vias 308 and the first conductive layer 2402 can be formed with an electrically conductive material, such as copper (Cu), a metallic material, or a metallic compound.

Figure 25:
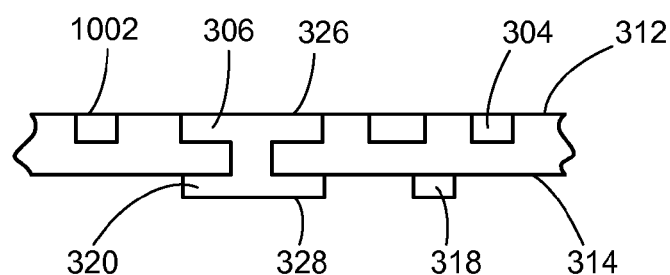
FIG. 25 is the structure of FIG. 24 in a second removal phase.

Referring now to FIG. 25, therein is shown the structure of FIG. 24 in a second removal phase. The second removal phase can include a conductor-removal method, such as etching, grinding, planarization, or other chemical or mechanical methods.

The conductor-removal method can be used to partially remove the first conductive layer 2402 of FIG. 24. The first conductive layer 2402 can be partially removed to form the first conductive traces 304 and the first conductive pads 306 in the upper holes 902 of FIG. 9. The first conductive traces 304, the first conductive pads 306, and the device connection side 312 can be coplanar with each other.

The first conductive traces 304 can include a physical feature at the first trace external surfaces 1002 in the upper holes 902 characteristic of the first conductive layer 2402 removed. The physical feature can include etched marks, tool removal marks, chemical residues, chemically processed surfaces, rough surfaces, uneven surfaces, or concave surfaces.

The first conductive pads 306 can include a physical feature at the first pad external surfaces 326 in the upper holes 902 characteristic of the first conductive layer 2402 removed. The physical feature can include etched marks, tool removal marks, chemical residues, chemically processed surfaces, rough surfaces, uneven surfaces, or concave surfaces.

The first exterior insulation layer 322 of FIG. 3 can be over or directly on the first conductive traces 304 and the device connection side 312. The first exterior insulation layer 322 can be partially within the upper holes 902. The first exterior insulation layer 322 can expose the first pad external surfaces 326 of the first conductive pads 306.

The second exterior insulation layer 324 of FIG. 3 can be over or directly on the second conductive traces 318 and the system connection side 314. The second exterior insulation layer 324 can be over or partially directly on the second conductive pads 320. The second exterior insulation layer 324 can partially expose the second pad external surfaces 328.

Figure 26:
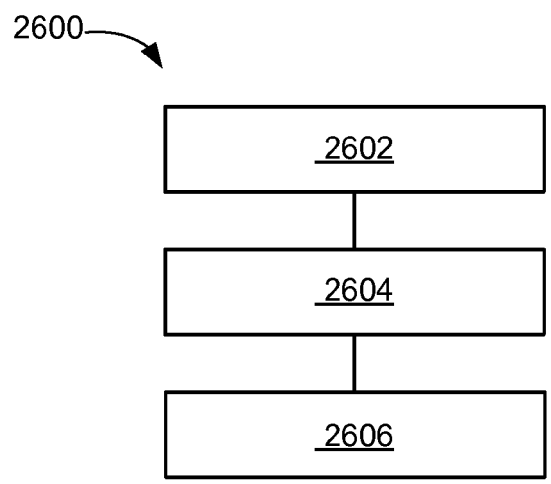
FIG. 26 is a flow chart of a method of manufacture of an integrated circuit packaging system in a further embodiment of the present invention.

Referring now to FIG. 26, therein is shown a flow chart of a method 2600 of manufacture of an integrated circuit packaging system in a further embodiment of the present invention. The method 2600 includes: forming a support structure including: providing a carrier having a conductive seed layer, forming an interior insulation layer directly on the conductive seed layer, forming an internal insulation layer directly on the interior insulation layer and the conductive seed layer, removing the conductive seed layer at a device connection side of the internal insulation layer, forming a hole of the internal insulation layer with the interior insulation layer removed at the device connection side, forming a first conductive pad in the hole at the device connection side, and forming an exterior insulation layer over the first conductive pad in a block 2602; mounting an integrated circuit over the exterior insulation layer at the device connection side in a block 2604; and forming an encapsulation over the integrated circuit in a block 2606.

Thus, it has been discovered that the integrated circuit packaging system of the present invention furnishes important and heretofore unknown and unavailable solutions, capabilities, and functional aspects for an integrated circuit packaging system with a support structure. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a support structure including:
      providing a carrier having a conductive seed layer,
      forming an interior insulation layer directly on the conductive seed layer,
      forming an internal insulation layer directly on the interior insulation layer and the conductive seed layer,
      etching the conductive seed layer at a device connection side of the internal insulation layer,
      forming a hole of the internal insulation layer with the interior insulation layer removed at the device connection side,
      forming a first conductive pad in the hole at the device connection side,
      forming a second conductive pad having an internal surface directly on a system connection side of the internal insulation layer, the system connection side opposite to the device connection side,
      forming an exterior insulation layer over the first conductive pad and directly on the device connection side, and
      forming a second exterior insulation layer over and partially directly on a second pad external surface of the second conductive pad, the second exterior insulation layer directly on the system connection side, and the second pad external surface facing away from the internal surface, and
      wherein the internal insulation layer is within the support structure;
   mounting an integrated circuit over the exterior insulation layer at the device connection side; and
   forming an encapsulation over the integrated circuit.

2. The method as claimed in claim 1 wherein forming the support structure includes forming the support structure having a conductive trace in another hole of the internal insulation layer at the device connection side with a conductive paste.

3. The method as claimed in claim 1 wherein forming the support structure includes forming the support structure having a via and the second conductive pad, the via within the internal insulation layer, at the system connection side of the internal insulation layer, and directly on the first conductive pad, and the second conductive pad directly on the via and the system connection side.

4. The method as claimed in claim 1 wherein forming the support structure includes forming the support structure having a conductive plate directly on a pad external surface of the first conductive pad.

5. The method as claimed in claim 1 wherein forming the support structure includes forming the support structure having a via below the hole and in the internal insulation layer with the first conductive pad directly on the via.

6. A method of manufacture of an integrated circuit packaging system comprising:
forming a support structure including:
providing a carrier having a conductive seed layer,
forming an interior insulation layer directly on the conductive seed layer,
forming an internal insulation layer directly on the interior insulation layer and the conductive seed layer,
etching the conductive seed layer at a device connection side of the internal insulation layer,
forming a hole of the internal insulation layer with the interior insulation layer removed at the device connection side,
forming a first conductive pad in the hole at the device connection side,
forming a second conductive pad having an internal surface directly on a system connection side of the internal insulation layer, the system connection side opposite to the device connection side,
forming an exterior insulation layer over the first conductive pad, directly on the device connection side, and partially exposing the first conductive pad and the internal insulation layer, and
forming a second exterior insulation layer over and partially directly on a second pad external surface of the second conductive pad, the second exterior insulation layer directly on the system connection side, and the second pad external surface facing away from the internal surface, and
wherein the internal insulation layer is within the support structure;
mounting an integrated circuit over the exterior insulation layer at the device connection side; and
forming an encapsulation over the integrated circuit.

7. The method as claimed in claim 6 wherein forming the support structure includes forming the support structure having a conductive trace in another hole of the internal insulation layer at the device connection side and the first conductive pad in the hole at the device connection side with conductive pastes.

8. The method as claimed in claim 6 wherein forming the support structure includes forming the support structure having a via, the second conductive pad, and the second exterior insulation layer, wherein the via is within the internal insulation layer, at the system connection side of the internal insulation layer, and is directly on the first conductive pad, and the second conductive pad is directly on the via and the system connection side, and the second exterior insulation layer is partially directly on the second conductive pad.

9. The method as claimed in claim 6 wherein forming the support structure includes forming the support structure having a conductive trace in the internal insulation layer and a conductive plate directly on a pad external surface of the first conductive pad and a trace external surface of the conductive trace.

10. The method as claimed in claim 6 wherein forming the support structure includes forming the support structure having a via below the hole and in the internal insulation layer with the first conductive pad directly on the via and having a pad external surface below the device connection side.

11. An integrated circuit packaging system comprising:
a support structure having:
an internal insulation layer having a hole, a device connection side, and a system connection side opposite to the device connection side, the internal insulation layer within the support structure,
a first conductive pad in the hole at the device connection side,
a second conductive pad having an internal surface directly on the system connection side,
an exterior insulation layer over the first conductive pad and directly on the device connection side, and
a second exterior insulation layer over and partially directly on a second pad external surface of the second conductive pad, the second exterior insulation layer directly on the system connection side, and the second pad external surface facing away from the internal surface;
an integrated circuit over the exterior insulation layer; and
an encapsulation over the integrated circuit.

12. The system as claimed in claim 11 wherein the support structure includes a conductive trace in another hole of the internal insulation layer at the device connection side, the conductive trace formed with a conductive paste.

13. The system as claimed in claim 11 wherein the support structure includes a via and the second conductive pad, the via within the internal insulation layer, at the system connection side of the internal insulation layer, and directly on the first conductive pad, and the second conductive pad directly on the via and the system connection side.

14. The system as claimed in claim 11 wherein the support structure includes a conductive plate directly on a pad external surface of the first conductive pad.

15. The system as claimed in claim 11 wherein the support structure includes a via below the hole and in the internal insulation layer with the first conductive pad directly on the via.

16. The system as claimed in claim 11 wherein the support structure includes the exterior insulation layer partially exposing the first conductive pad and the internal insulation layer.

17. The system as claimed in claim 16 wherein the support structure includes a conductive trace in another hole of the internal insulation layer at the device connection side and the first conductive pad in the hole at the device connection side, the conductive trace and the first conductive pad formed with conductive pastes.

18. The system as claimed in claim 16 wherein the support structure includes a via, the second conductive pad, and the second exterior insulation layer, wherein the via is within the internal insulation layer, at the system connection side of the internal insulation layer, and is directly on the first conductive pad, the second conductive pad is directly on the via and the system connection side, and the second exterior insulation layer is partially directly on the second conductive pad.

19. The system as claimed in claim 16 wherein the support structure includes a conductive trace in the internal insulation layer and a conductive plate directly on a pad external surface of the first conductive pad and a trace external surface of the conductive trace.

20. The system as claimed in claim 16 wherein the support structure includes a via below the hole and in the internal insulation layer with the first conductive pad directly on the via and having a pad external surface below the device connection side.

* * * * *